US007834676B2

(12) United States Patent
Lee et al.

(10) Patent No.: US 7,834,676 B2
(45) Date of Patent: Nov. 16, 2010

(54) METHOD AND APPARATUS FOR ACCOUNTING FOR CHANGES IN TRANSISTOR CHARACTERISTICS

(75) Inventors: Woo-Geun Lee, Yongin-si (KR); Jean-Ho Song, Seoul (KR); Yeong-Keun Kwon, Suwon-si (KR); Min-Cheol Lee, Seoul (KR); Ki-Won Kim, Suwon-si (KR); Young-Wook Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/357,261

(22) Filed: Jan. 21, 2009

(65) Prior Publication Data

US 2010/0182068 A1 Jul. 22, 2010

(51) Int. Cl.
*G11C 11/34* (2006.01)

(52) U.S. Cl. ................................. 327/362; 365/185.14

(58) Field of Classification Search ................. 327/262, 327/538–541, 544–546; 365/185.14
See application file for complete search history.

(56) References Cited

U.S. PATENT DOCUMENTS 4,974,239 A * 11/1990 Miwada ....................... 377/60
5,892,714 A * 4/1999 Choi ..................... 365/185.22
6,212,100 B1 * 4/2001 Choi ..................... 365/185.14
6,614,301 B2 * 9/2003 Casper et al. ............... 330/253
7,129,938 B2 * 10/2006 Naugler, Jr. ................. 345/207

FOREIGN PATENT DOCUMENTS

KR 1020050046173 A 5/2005
KR 1020050106983 A 11/2005
KR 1020070018223 A 2/2007
KR 1020070084944 A 8/2007

* cited by examiner

*Primary Examiner*—Dinh T. Le
(74) *Attorney, Agent, or Firm*—Innovation Counsel LLP

(57) ABSTRACT

A device for accounting for changes in characteristics of a transistor is presented. The device includes a transistor and a comparator receiving a feedback signal from the transistor and a reference signal. The comparator provides an output to a bias voltage generator. The bias voltage generator includes an input connected to the output of the comparator and an output connected to the transistor. In some embodiments of the invention the transistor is a double gate transistor and the bias voltage generator is applied to a top gate of the double gate transistor in order to control characteristics of the transistor such as turn on voltage.

15 Claims, 7 Drawing Sheets

METHOD AND APPARATUS FOR ACCOUNTING FOR CHANGES IN TRANSISTOR CHARACTERISTICS

FIELD OF THE INVENTION

The present invention accounts for changes in transistor characteristics. One embodiment of the invention accounts for changes in threshold voltage of a transistor.

BACKGROUND OF THE INVENTION

Transistors are used in many applications using electronic circuits. Transistors in general have a turn on voltage commonly referred to as a threshold voltage. In some applications once a threshold voltage is applied to a transistor, the transistor can be referred to as being in an "on" state allowing current to flow through the transistor.

In Liquid Crystal Display (LCD) technology, transistors are used to manipulate liquid crystals. The orientation of the liquid crystals is manipulated to allow more or less light to pass by the liquid crystals to a display. Varying light intensities can be displayed based on the orientation of the liquid crystals. If the light passes through color filters, different colors are displayed.

SUMMARY OF THE INVENTION

In an embodiment of the invention it has been recognized that in order to effectively control the liquid crystals, the transistor threshold voltage should not vary. In order to control the threshold voltage, a bias voltage is used to account for variations in the threshold voltage. This may be accomplished in some embodiments of the invention by monitoring a current of the transistor.

More specifically an embodiment of the invention is a method for accounting for changes in transistor characteristics. The method includes receiving a feedback signal from a transistor; comparing the feedback signal with a reference signal and producing an output signal; and adjusting a bias voltage supplied to the transistor based on the output signal.

In some embodiments of the invention, the bias voltage supplied to the transistor is adjusted based on the difference between the reference signal and the feedback signal.

In other embodiments of the invention, the transistor is a double gate transistor having a top gate and a bottom gate and the bias voltage is applied to the top gate.

In some instances, the bias voltage to the transistor is adjusted based on the difference between the reference signal and the feedback signal.

In other instances, the bias voltage accommodates for changes in a threshold voltage of the transistor.

The feedback signal in some embodiments of the invention is a current of the transistor.

The bias voltage to the transistor, in other embodiments of the invention, is adjusted to maintain a constant threshold voltage for the transistor.

An alternate embodiment of the invention is a device for accounting for changes in characteristics of a transistor. The device includes a transistor; a comparator having an output, the comparator receiving a feedback signal from the transistor and a reference signal; and a bias voltage generator comprising an input connected to the output of the comparator and an output connected to the transistor.

The bias voltage generator, in some embodiments of the invention, is connected to a gate of the transistor.

In other embodiments of the invention, the transistor is a double gate transistor.

In some cases the bias voltage generator is connected to the top gate of the double gate transistor.

In other cases the comparator is connected to a drain of the transistor.

Another embodiment of the invention is a device for adjusting a threshold voltage of a transistor. The device includes a means for comparing a feedback signal with a reference signal and producing an output signal; and a means for adjusting a bias voltage supplied to the transistor based on the output signal.

In some embodiments of the invention, the means for adjusting adjusts the bias voltage supplied to the transistor to accommodate for changes in the transistor's threshold voltage.

In other embodiments of the invention the means for adjusting adjusts the bias voltage supplied to the transistor based on the difference between the current of the transistor and the reference voltage.

An alternate embodiment of the invention is a device for accounting for changes in transistor characteristics. The device includes a transistor; a dummy device; a comparator receiving a current from the dummy device and a reference signal; and a bias voltage generator comprising an input connected to the comparator and an output connected to the transistor.

In some instances, the dummy device is a dummy transistor.

In other instances the transistor further comprises a top gate and the output of the bias voltage generator is connected to a top gate of the transistor.

BRIEF DESCRIPTION OF THE DRAWINGS

The above and other aspects of the present invention will become more apparent by describing in detail embodiments thereof with reference to the accompanying drawings, in which.

DETAILED DESCRIPTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
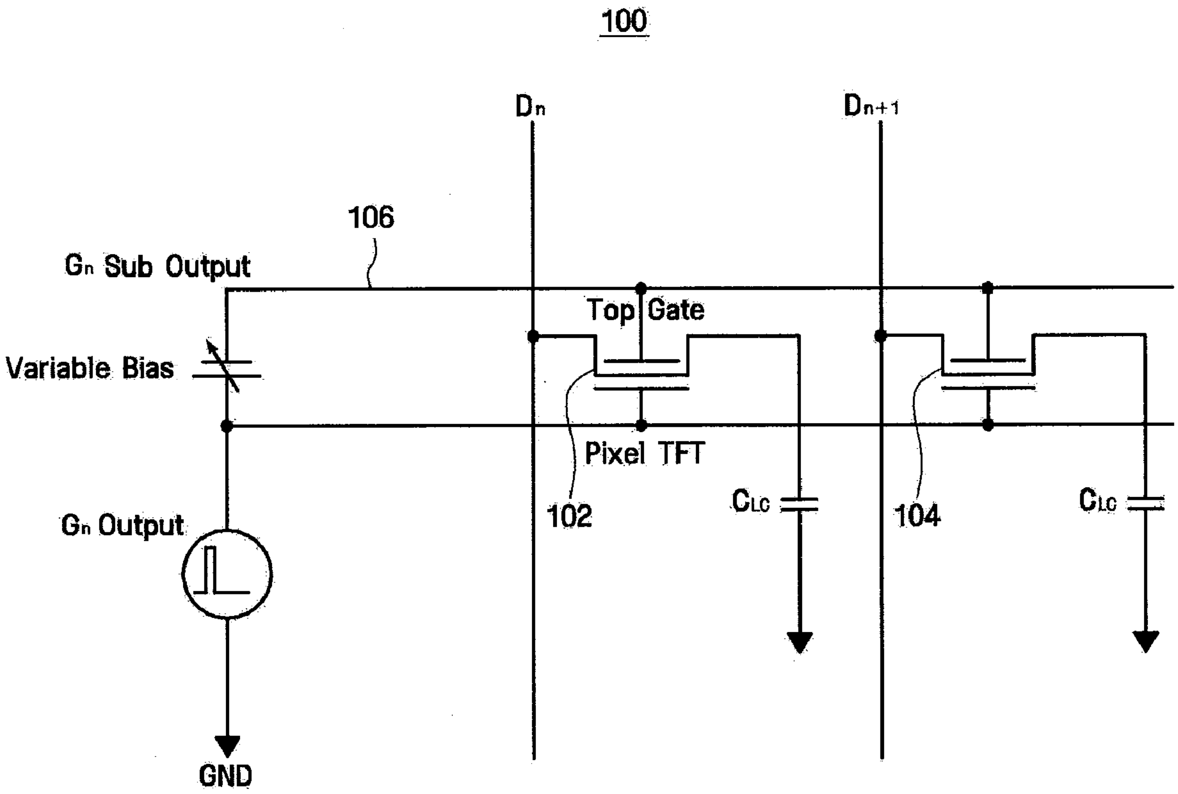
FIG. 1 is a schematic diagram of a double gate Thin Film Transistor (TFT) of a Liquid Crystal Display (LCD) implementing a variable bias.

FIG. 1 is an illustration of one portion of a Liquid Crystal Display (LCD) 100 having double gate Thin Film Transistors (TFTs) 102 and 104. Data lines $D_n$, $D_{n+1}$ separate each of the TFTs 102 and 104 into columns. Data lines $D_n$ and $D_{n+1}$ are connected to a source of each of the TFTs 102 and 104. The information supplied by data lines $D_n$ and $D_{n+1}$ is used to determine when to turn on each of the TFTs 102 and 104.

Gate line 106 is connected to a top gate of the TFTs 102 and 104, and gate line 108 is connected to a bottom gate of the TFTs 102 and 104.

A capacitor $C_{LC}$ is connected to a drain of each of the TFTs 102 and 104.

In operation, an output voltage, $G_n$ Output, is applied to the bottom gate of TFTs 102 and 104. A Variable Bias generates an output, $G_n$ Sub Output, which is applied to the top gate of each of the TFTs 102 and 104. The output, $G_n$ Sub Output, form the Variable Bias is useful in controlling the turn on voltage of the TFTs 102 and 104.

In some cases the characteristics of the TFTs 102 and 104 may change. In these instances the output, $G_n$ Sub Output, of the Variable Bias can be adjusted to maintain a constant turn on voltage. In general the Variable Bias output, $G_n$ Sub Output, can be used to change the characteristics of and/or control the TFTs individually, in sequence, all at once or any other way depending on the set up and arrangement.

Figure 2:
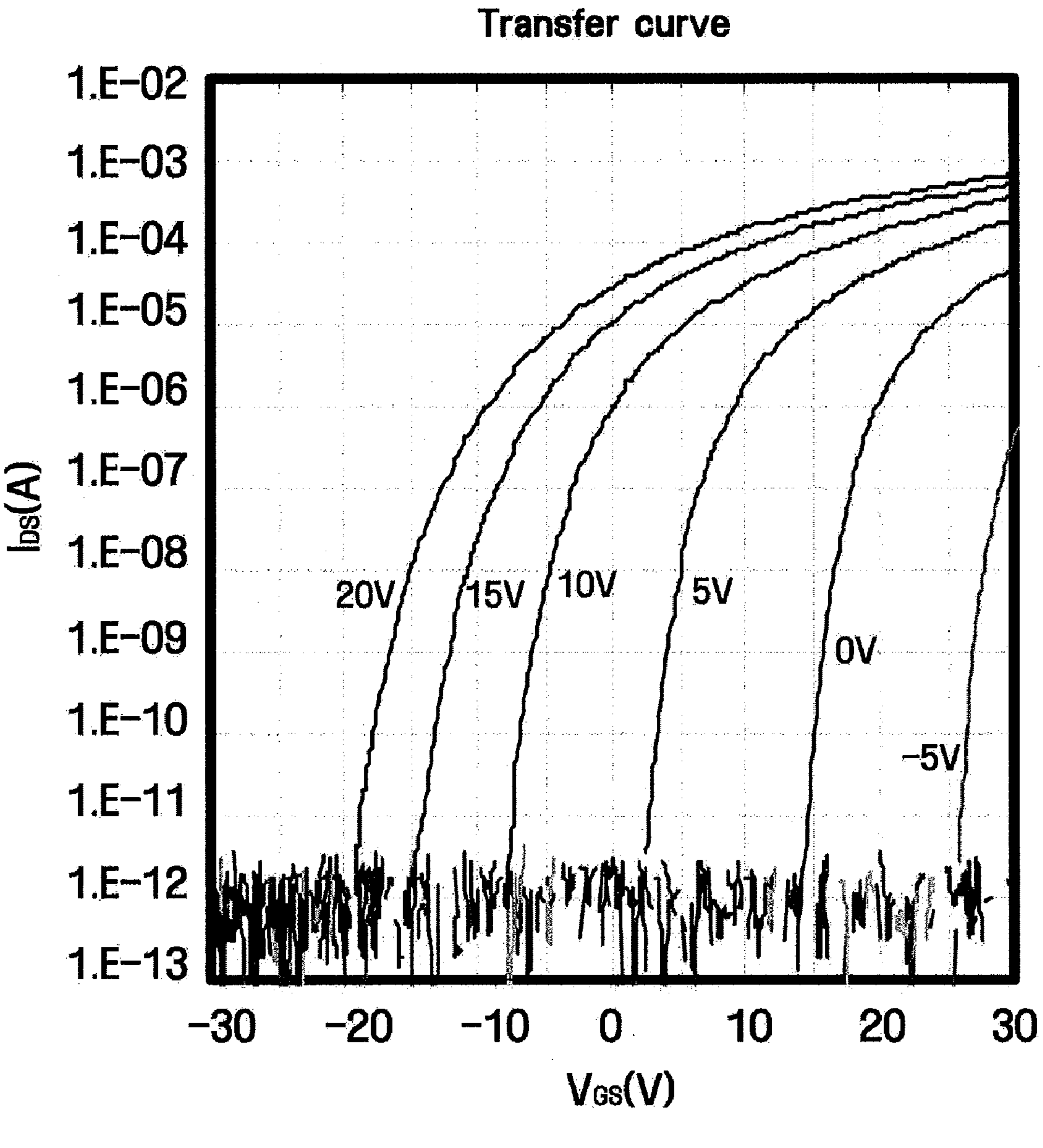
FIG. 2 is a graph showing variations of threshold voltage versus current in an Amorphous Oxide Semiconductor (AOS) double gate structure.

FIG. 2 is a graph illustrating transfer curve characteristics of a TFT. The voltages on the horizontal axis of the graph represent voltages applied to the bottom gate of a TFT. The currents on the vertical axis of the graph represent the TFT drain source current. Each of the curves on the graph represents voltages applied to the top gate of the TFT.

In one example suppose a TFT is to have a turn on voltage of 20 V. In some embodiments of the invention this would indicate that 20V should be applied to the bottom gate of the TFT. The top gate bias voltage to be applied in this case would be 10 V and the TFT drain source current would be 1.E-04 A. In this same example suppose 20V is applied to the bottom gate, but the TFT drain source current is only 1.E-07 A. This would indicate that in order to have a turn on voltage of 20V, a bias voltage of 10V is needed.

Figure 3:
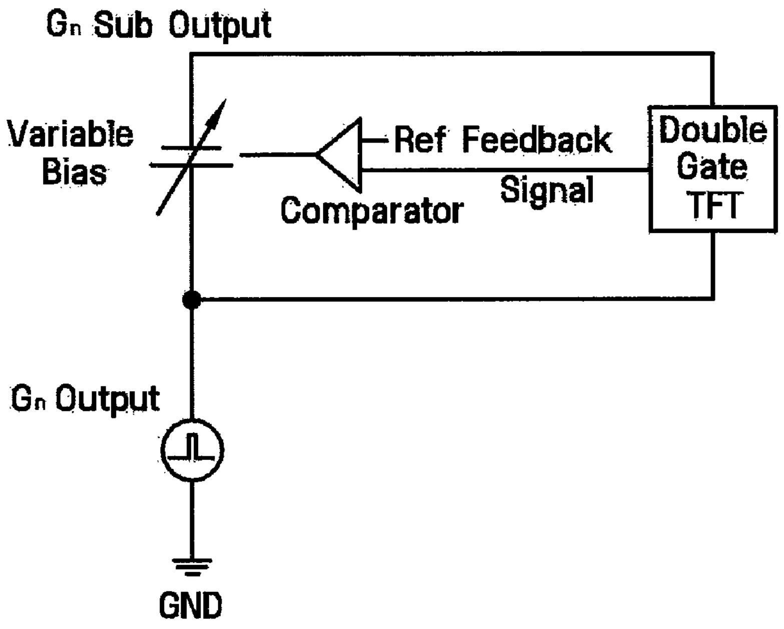
FIG. 3 is a schematic diagram of a double gate Thin Film Transistor (TFT) implementing a variable bias and comparator.

FIG. 3 is a schematic diagram illustrating one embodiment of the invention which can be used to adjust the bias voltage to properly control a TFT. In this embodiment of the invention a voltage, $G_n$ Output, is supplied to a bottom gate of a Double Gate TFT. A Feedback Signal is relayed from the Double Gate TFT to the Variable Bias through a Comparator.

The Comparator receives the Feedback Signal from the Double Gate TFT and compares the Feedback Signal to a Reference Signal. The output of the Comparator is sent to the Variable Bias.

The Variable Bias receives the output of the Comparator. Based on the output of the Comparator, the Variable Bias outputs a signal, $G_n$ Sub Output, to the top gate of the Double Gate TFT. The TFT turn on voltage can be controlled effectively by adjusting the Variable Bias utilizing the comparison from the Comparator of the Feedback Signal and the Reference Signal.

Referring to FIG. 2, imagine a turn on voltage of 20V is applied to a bottom gate of a TFT. If the TFT drain source current is only 1.E-07 A and the Reference Signal indicates that the TFT drain source current should be 1.E-04, the comparator would output a signal to the Variable Bias that a the voltage to be supplied to the top gate of the TFT should be 10 V. The Variable Bias would then adjust so that the output signal, $G_n$ Sub Output, will be 10V.

Figure 4:
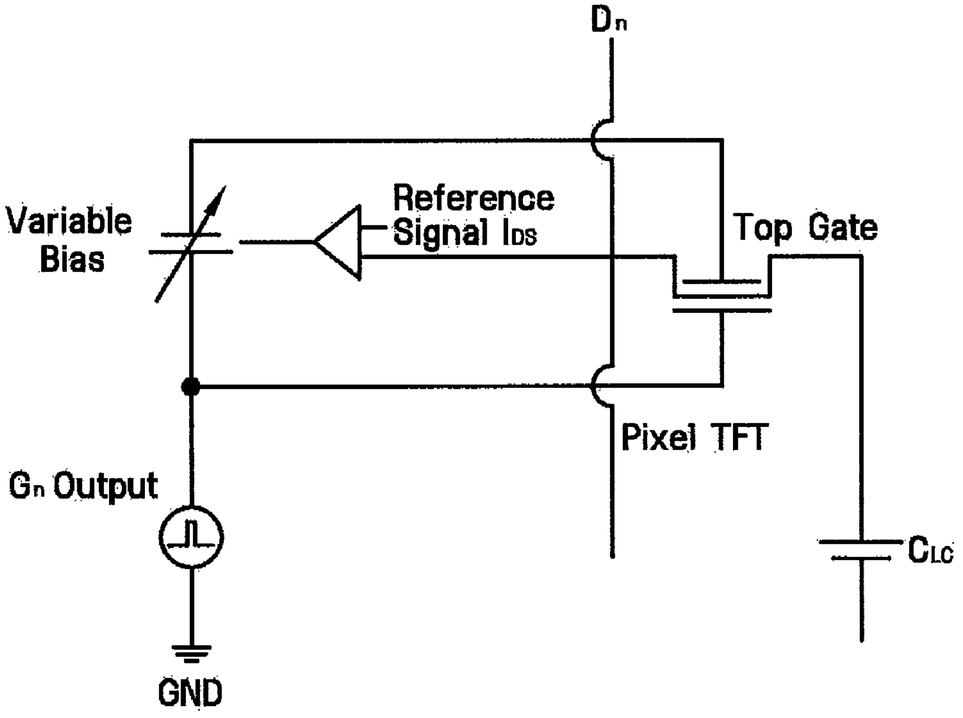
FIG. 4 is a schematic diagram of a double gate Thin Film Transistor (TFT) implementing a variable bias and comparator using a drain source current as a feedback signal.

FIG. 4 is an illustration of another embodiment of the invention. In this embodiment of the invention a double gate TFT receives an input signal, $G_n$ Output, at a bottom gate of the TFT. The drain of the TFT is connected to a capacitor, $C_{LC}$. The top gate of the TFT is connected to a Variable Bias and receives an output, $G_n$ Sub Output, from the Variable Bias. The Comparator receives a drain source current input, $I_{DS}$, from the TFT and compares that input to a Reference Signal.

In this embodiment of the invention an input signal, $G_n$ Output, is applied to the bottom gate of the TFT. The drain source current, $I_{DS}$, is used as an input to the comparator. The Comparator also receives a Reference Signal as an input and compares the Reference Signal to the drain source current, $I_{DS}$. The result of this comparison is output to the Variable Bias. The Variable Bias outputs a voltage to the top gate of the TFT based on the output of the Comparator.

Figure 5:
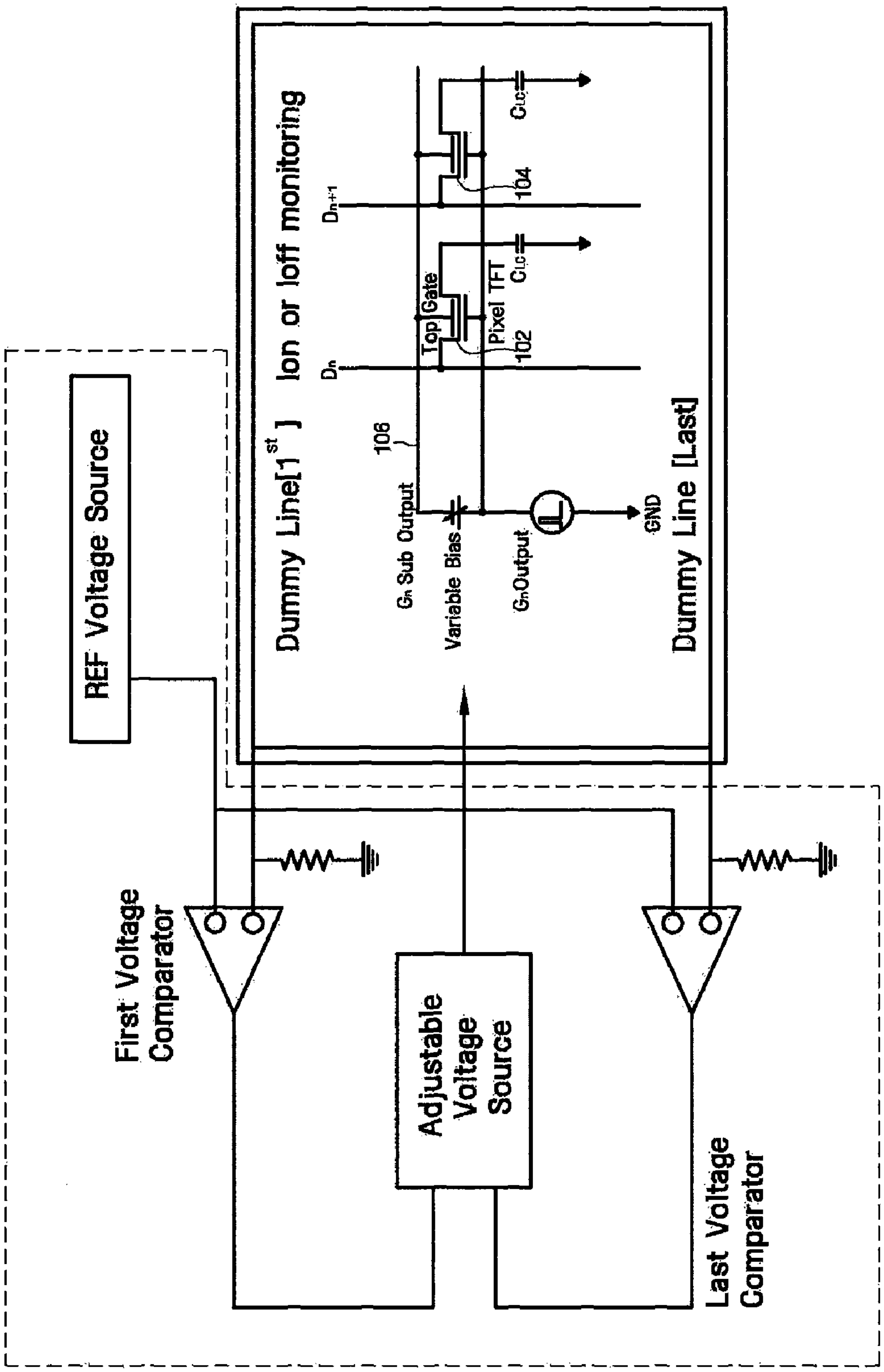
FIG. 5 is a schematic diagram of a double gate Thin Film Transistor (TFT) implementing a variable bias, comparator and dummy TFTs.

FIG. 5 is an illustration of an alternate embodiment of the invention. In this embodiment it has been found that measuring signals directly from the TFT may be undesirable. In these and other cases, it may be desirable to use one or more dummy TFTs. FIG. 5 illustrates the use of two dummy TFTs in a pixel row of a display. The first and last TFTs in the pixel row of the display are not used and are merely dummy TFTs to take measurements.

Referring to FIG. 5, Dummy Line ($1^{st}$) is connected to a first dummy TFT. Dummy Line (last) is connected to a last dummy TFT. A First Voltage Comparator is connected to the first dummy TFT and a Last Voltage Comparator is connected to the last dummy TFT. The signals from the first and last Dummy TFTs are received by the First and Last Voltage Comparators, respectively and are compared to a REF Voltage Source. The outputs of each of the First and Last VoltageCcomparators are inputted to the Adjustable Voltage Source. A top gate voltage is applied to the TFTs from the Adjustable Voltage Source.

In some embodiments of the invention the Adjustable Voltage Source selects a top gate voltage based on the $1^{st}$ and last dummy TFTs drain current. In other embodiments of the invention, the Adjustable Voltage Source selects a top gate voltage based on a voltage measurement from the $1^{st}$ and last dummy TFTs.

Figure 6:
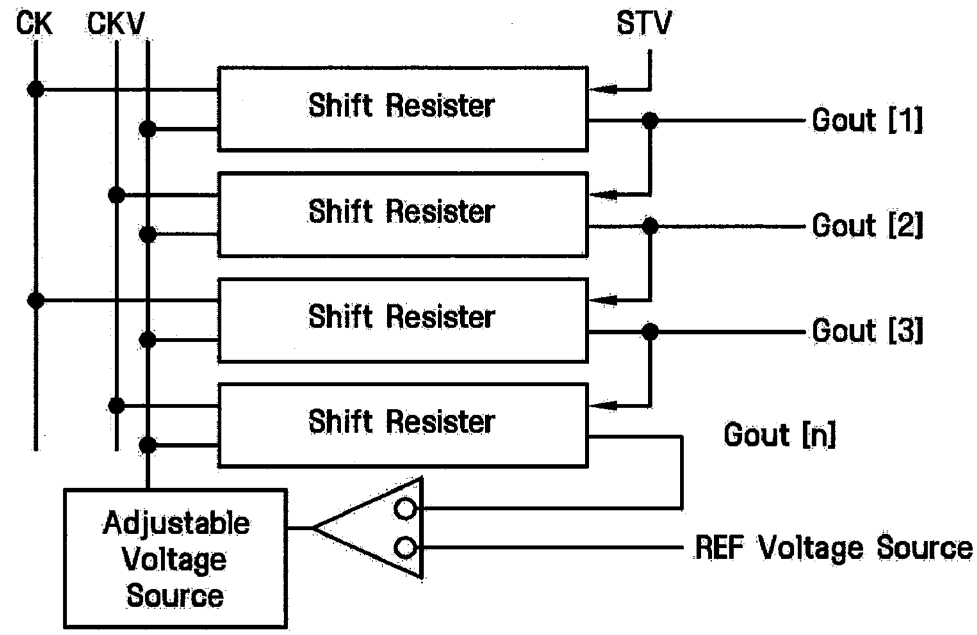
FIG. 6 is an illustration of gate integration circuit for a Liquid Crystal Display (LCD) implementing shift registers for Thin Film Transistors (TFTs).

FIG. 6 is an illustration of a gate integration compensation circuit. In this embodiment of the invention, shift registers are used to apply applicable top gate voltages in sequence. Using clock signals CKV, CKVB and STV, top gate voltages are supplied sequentially to each TFT in a row. A comparator receives both a REF Voltage Source and an output, $G_{out}$. The comparator provides an output based on the comparison of the REF Voltage Source and the dummy output to an Adjustable Voltage Source. The Adjustable Voltage Source then provides an output to the Shift Registers to apply the desired top gate voltage to each of the TFTs sequentially.

Figure 7:
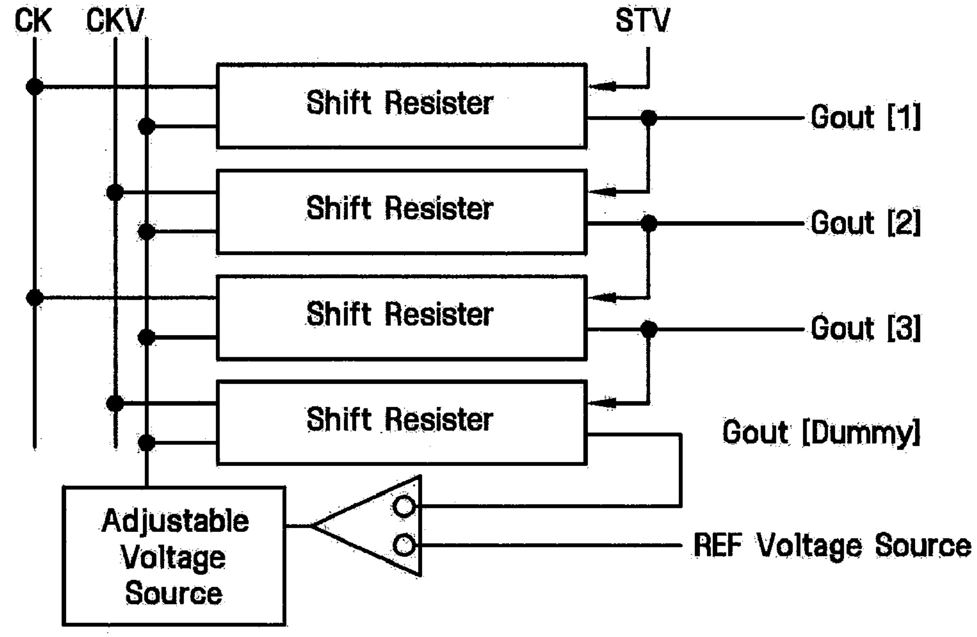
FIG. 7 is an illustration of a gate integration circuit for a Liquid Crystal Display (LCD) implementing shift registers for Thin Film Transistors (TFTs) and utilizing a dummy TFT.

FIG. 7 is an illustration of a gate integration compensation circuit. In this embodiment of the invention, shift registers are used to apply applicable top gate voltages in sequence. Using clock signals CKV, CKVB and STV, top gate voltages are supplied sequentially to each TFT in a row. The last shift register is applied to a dummy TFT and is supplied to a comparator. The comparator receives both a REF Voltage Source and a dummy output, $G_{out[Dummy]}$. The comparator provides an output based on the comparison of the REF Voltage Source and the dummy output to an Adjustable Voltage Source. The adjustable voltage source then provides an output to the Shift Registers to apply the desired top gate voltage to each of the TFTs sequentially.

Figure 8:
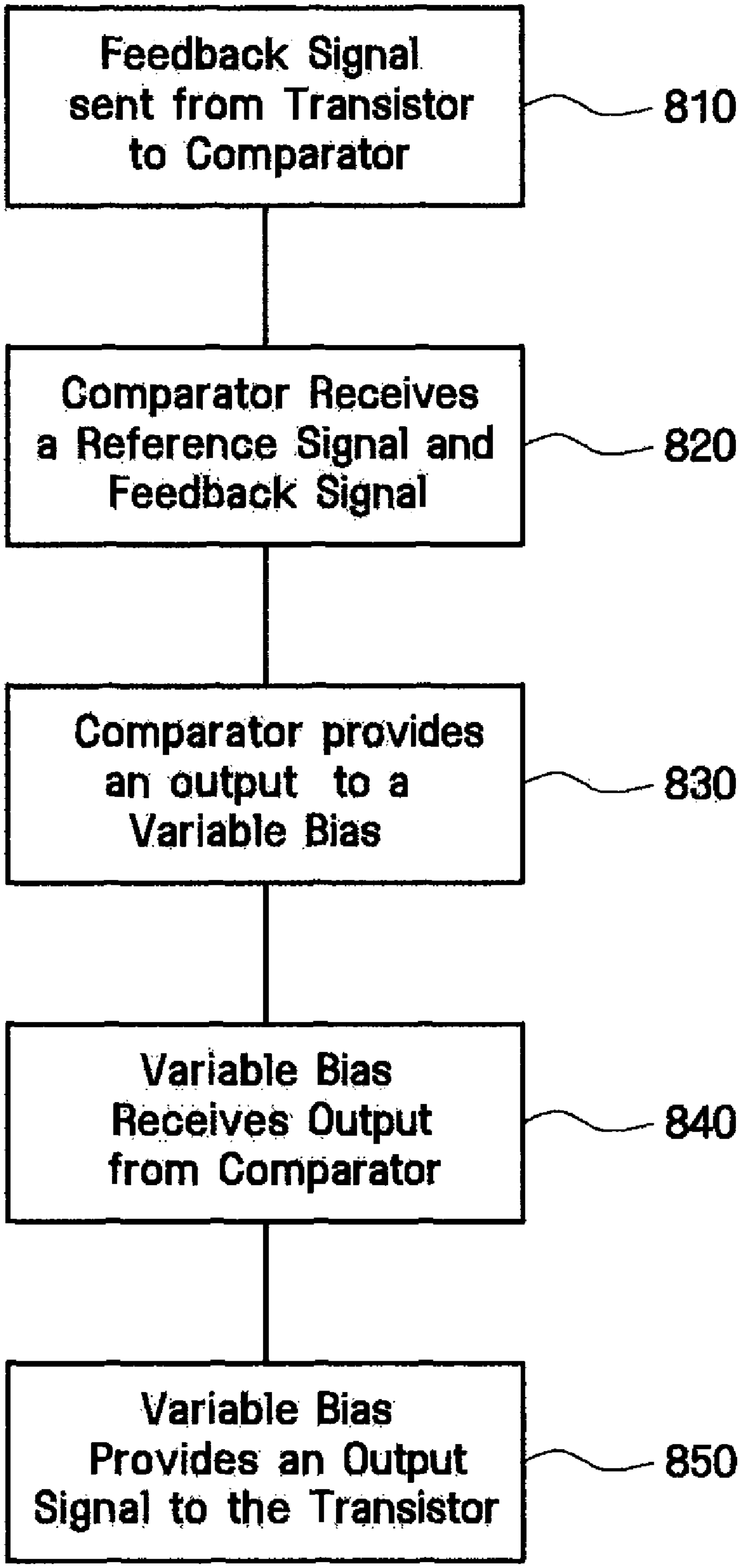
FIG. 8 is an illustration showing a method for controlling a threshold voltage of a This Film Transistor (TFT).

FIG. 8 is an illustration of a method of accounting for changes in transistor characteristics. In this embodiment of the invention in step 810 a feedback signal is sent from the transistor to a comparator. The feedback signal in some embodiments can be a voltage or a current such as a drain source current.

In step 820 the comparator receives a reference signal and the feedback signal.

In step 830 the comparator provides an output to a variable bias.

In step 840 the variable bias receives the output from the comparator.

In step 850 the variable bias provides an output signal to the transistor. In some embodiments of the invention an appropriate signal is provided to the transistor to achieve the desired turn on voltage. In other embodiments of the invention characteristics of the transistor are controlled. In alternate embodiments of the invention the variable bias supplies a signal to the top gate of a double gate transistor.

Figure 9:
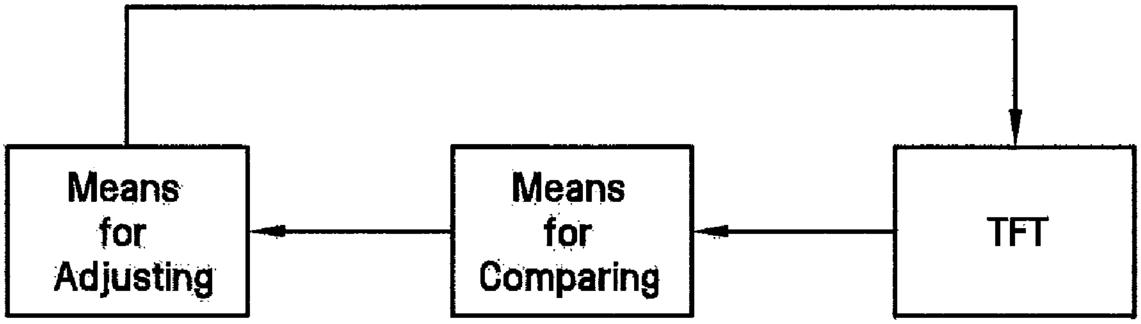
FIG. 9 is an illustration of a means for controlling a threshold voltage of a Thin Film Transistor (TFT).

FIG. 9 is a schematic diagram illustrating one embodiment of the invention which can be used to adjust the bias voltage to properly control a TFT. In this embodiment of the invention a TFT is connected to a means for comparing an output signal from the TFT to a reference signal. The means for comparing provides an output to a means for adjusting a bias voltage. The means for adjusting a bias voltage provides an output signal to the TFT.

The TFT can in some instances be a double gate TFT. In this case, a turn on voltage can be applied to the bottom gate of the TFT. A drain source current of the TFT can then be measured and sent to the means for comparing. The means for comparing, as illustrated, receives a reference signal, which in some cases is compared to the drain source current to provide an output to the means for adjusting a bias voltage.

The means for adjusting a bias voltage receives the output from the means for comparing and provides a bias voltage to the top gate of the TFT.

Referring to FIG. 2, if a turn on voltage of 20V is desired, a drain source current of 1.E-04 A is needed. If for example the means for comparing receives a drain source current of only 1.E-07 A from the TFT, the current is compared to a reference current to provide an output to the means for adjusting a bias voltage.

The output provided by the means for comparing is received by the means for adjusting a bias voltage which generates a bias voltage output to be supplied to the top gate of the TFT. In this example a top gate voltage of 10.V is needed to achieve a turn on voltage of 20V. In some embodiments of the invention the top gate voltage can be manipulated to control the turn on voltage of the TFTs.

This disclosure of invention has been made with reference to exemplary embodiments. However, many modifications and variations will be apparent to those skilled in the art in light of the foregoing description. Accordingly, the present disclosure of invention embraces all such modifications and variations that fall within the spirit and scope of the here presented teachings.

What is claimed is:

1. A method for accounting for changes in characteristics of a transistor, the method comprising:

receiving a feedback signal from a transistor;

comparing the feedback signal with a reference signal and producing an output signal; and adjusting a bias voltage supplied to the transistor based on the output signal, wherein the transistor is a double gate transistor having a top gate and a bottom gate and the bias voltage is applied to the top gate, and wherein the bias voltage is generated from a bias generator which is coupled between the top gate and the bottom gate.

2. The method a recited in claim 1 wherein the bias voltage supplied to the transistor is adjusted based on the difference between the reference signal and the feedback signal.

3. The method as recited in claim 1 wherein the bias voltage to the transistor is adjusted based on the difference between the reference signal and the feedback signal.

4. The method as recited in claim 1 wherein the bias voltage accommodates for changes in a threshold voltage of the transistor.

5. The method as recited in claim 1 wherein the feedback signal is a current of the transistor.

6. The method of claim 1 wherein the bias voltage to the transistor is adjusted to maintain a constant threshold voltage for the transistor.

7. A device for accounting for changes in characteristics of a transistor, the device comprising:

a transistor;

a comparator having an output, the comparator receiving a feedback signal from the transistor and a reference signal; and a bias voltage generator comprising an input connected to the output of the comparator and an output connected to the transistor, wherein the transistor is a double gate transistor having a top gate and a bottom gate and the bias voltage is applied to the top gate, and wherein the bias voltage generator is coupled between the top gate and the bottom gate.

8. The device as recited in claim 7 wherein the bias voltage generator is connected to the top gate of the double gate transistor.

9. The device as recited in claim 7 wherein the comparator is connected to a drain of the transistor.

10. A device for adjusting a threshold voltage of a transistor, the device comprising:

means for comparing a feedback signal from the transistor with a reference signal and producing an output signal; and means for adjusting a bias voltage supplied to the transistor based on the output signal, wherein the transistor is a double gate transistor having a top gate and a bottom gate and the bias voltage is applied to the top gate, and wherein the bias voltage is generated from a bias generator which is coupled between the top gate and the bottom gate.

11. The device as recited in claim 10 wherein the means for adjusting adjusts the bias voltage supplied to the transistor to accommodate for changes in the transistor's threshold voltage.

12. The device as recited in claim 10 wherein the means for adjusting adjusts the bias voltage supplied to the transistor based on the difference between the current of the transistor and the reference voltage.

13. A device for accounting for changes in transistor characteristics, the device comprising:

a transistor;

a dummy device:

a comparator receiving a current from the dummy device and a reference signal; and a bias voltage generator comprising an input connected to the comparator and an output connected to the transistor, the bias voltage generator supplying a signal to the transistor based on the output from the comparator, wherein the transistor is a double gate transistor having a top gate and a bottom gate and the bias voltage is applied to the top gate.

14. The device as recited in claim 13 wherein the dummy device is a dummy transistor.

15. The device as recited in claim 13 wherein the transistor further comprises a top gate and the output of the bias voltage generator is connected to a top gate of the transistor.

* * * * *